(12) United States Patent
Kim et al.

(10) Patent No.: US 11,101,338 B2
(45) Date of Patent: Aug. 24, 2021

(54) THIN FILM TRANSISTOR WITH SMALL STORAGE CAPACITOR WITH METAL OXIDE SWITCH

(71) Applicant: Applied Materials, Inc., Santa Clara, CA (US)

(72) Inventors: Jung Bae Kim, San Jose, CA (US); Dong-Kil Yim, Pleasanton, CA (US); Soo Young Choi, Fremont, CA (US); Lai Zhao, Campbell, CA (US)

(73) Assignee: APPLIED MATERIALS, INC., Houston, TX (US)

( * ) Notice: Subject to any disclaimer, the term of this patent is extended or adjusted under 35 U.S.C. 154(b) by 112 days.

(21) Appl. No.: 16/243,314

(22) Filed: Jan. 9, 2019

(65) Prior Publication Data

US 2019/0214447 A1    Jul. 11, 2019

Related U.S. Application Data

(60) Provisional application No. 62/616,314, filed on Jan. 11, 2018.

(51) Int. Cl.
*H01L 27/32* (2006.01)
*H01L 27/12* (2006.01)
*G09G 3/3233* (2016.01)

(52) U.S. Cl.
CPC ...... *H01L 27/3265* (2013.01); *H01L 27/3262* (2013.01); *H01L 27/3272* (2013.01); *G09G 3/3233* (2013.01); *G09G 2300/0426* (2013.01); *G09G 2300/0465* (2013.01); *G09G 2300/0842* (2013.01); *H01L 27/1225* (2013.01); *H01L 27/1229* (2013.01); *H01L 27/1255* (2013.01)

(58) Field of Classification Search
CPC ............. H01L 27/3265; H01L 27/3262; H01L 27/1225; G09G 2300/0465; G09G 3/3233
See application file for complete search history.

(56) References Cited

U.S. PATENT DOCUMENTS

| | | | |
|---|---|---|---|
| 6,307,322 B1 | 10/2001 | Dawson et al. | |
| 9,818,765 B2 | 11/2017 | Osawa et al. | |
| 2003/0141811 A1* | 7/2003 | Park | H01L 27/1255 313/506 |
| 2003/0222589 A1 | 12/2003 | Osame et al. | |
| 2013/0337596 A1 | 12/2013 | Hung et al. | |
| 2014/0104508 A1* | 4/2014 | Yamazaki | G02F 1/1333 349/12 |
| 2015/0055051 A1 | 2/2015 | Osawa et al. | |
| 2015/0243720 A1 | 8/2015 | Kwon et al. | |

(Continued)

OTHER PUBLICATIONS

LTPO Could Replace LTPS for OLED Backplanes. Musing-Weekly Newsletter. OLED Association, Sep. 3, 2018 (https://www.oled-a.org/ltpo-could-replace-ltps-for-oled-backplanes_9318.html).

(Continued)

*Primary Examiner* — Latanya N Crawford Eason
(74) *Attorney, Agent, or Firm* — Patterson + Sheridan LLP; B. Todd Patterson

(57) ABSTRACT

Disclosed herein is a sub-pixel circuit for a display device. The sub-pixel circuit has a driving TFT and at least one switching TFT. The at least one switching TFT is an oxide TFT. The sub-pixel circuit additionally has at least one storage capacitor wherein the storage capacitor has a capacitance between about 1 fF and about 55 fF.

16 Claims, 8 Drawing Sheets

(56) References Cited

U.S. PATENT DOCUMENTS

| | | |
|---|---|---|
| 2016/0099300 A1* | 4/2016 | Lee .................... H01L 27/1255 257/40 |
| 2016/0190221 A1 | 6/2016 | Cho et al. |
| 2017/0092196 A1 | 3/2017 | Gupta et al. |
| 2017/0338249 A1 | 11/2017 | Suzumura et al. |
| 2018/0240821 A1 | 8/2018 | Lu et al. |
| 2019/0265532 A1* | 8/2019 | Yamazaki ........... G02F 1/13338 |
| 2019/0317374 A1* | 10/2019 | Yamazaki ......... H01L 29/78696 |
| 2020/0152663 A1* | 5/2020 | Li ....................... H01L 27/1251 |

OTHER PUBLICATIONS

International Search Report and Written Opinion for Application No. PCT/US2019/012936 dated May 8, 2019.

* cited by examiner

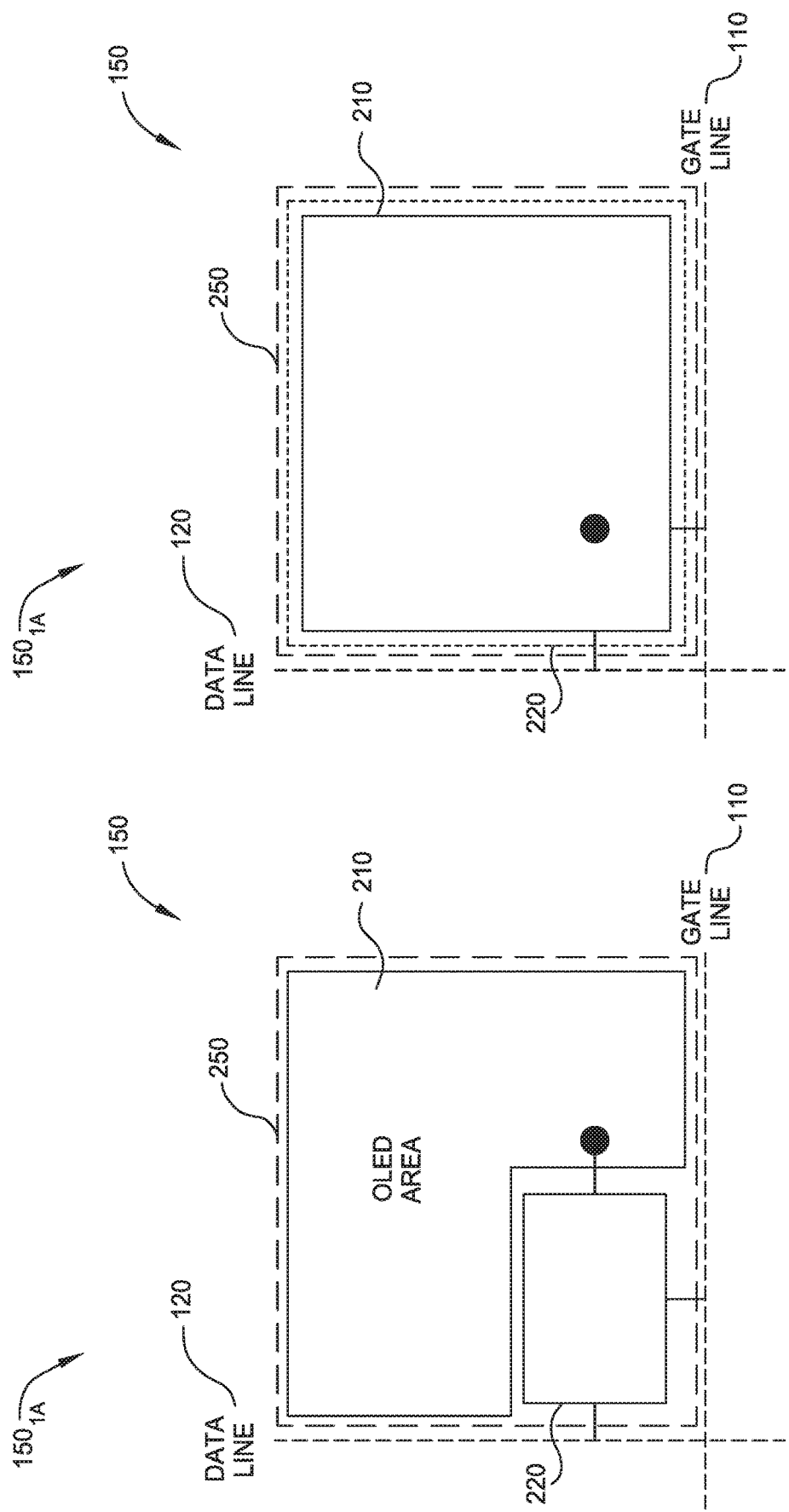

THIN FILM TRANSISTOR WITH SMALL STORAGE CAPACITOR WITH METAL OXIDE SWITCH

CROSS-REFERENCE TO RELATED APPLICATIONS

This application claims benefit of U.S. Provisional Application Ser. No. 62/616,314, filed Jan. 11, 2018, of which is incorporated by reference in its entirety.

BACKGROUND

Field

The present disclosure generally relates to a thin film transistor having a storage capacitor that is miniaturized. The thin film transistor may be utilized in a display screen such as an organic light emitting diode (OLED) display screen.

Description of the Related Art

Input devices including display devices may be used in a variety of electronic systems. The display resolution tells you how many pixels your screen can display horizontally and vertically. It's written in the form N×M. In this example, the screen can show N pixels horizontally, and M vertically. If you're comparing two screens of the same size but with different resolutions, the screen with the higher resolution (that's the one with more pixels) will be able to show you more of what you're working on, so you don't have to scroll so much. The higher the resolution of the display, the greater degree of detail for clear quality images the display will produce.

High resolution display devices for organic light emitting diode OLED, having greater than 600 ppi (pixels per inch), require very small pixel sizes. Each pixel may have three or more sub-pixels to set a color at the pixel. With shrinking pixel sizes, everything becomes smaller with high resolution displays. For example, the circuitry driving the sub-pixel will have a smaller foot print. The circuitry driving the sub-pixel has a plurality of thin film transistors and capacitors as well as an organic light emitting diode (OLED) area. The thin film transistor (TFT) size can be shrunken based on pixel size shrinkage from high resolution. However, it is difficult to make storage capacitors associated with the TFT circuit smaller since the required storage capacitance is mainly determined by frame rate and leakage current through the TFT connected to the storage capacitance. Thus, further reduction of the pixel footprint is difficult.

As a result, new technology should be developed that can reduce the pixel footprint size.

SUMMARY

Disclosed herein is a sub-pixel circuit for a display device. In one embodiment, the sub-pixel circuit has a driving TFT and at least one switching TFT. The at least one switching TFT is an oxide TFT. The sub-pixel circuit additionally has at least one storage capacitor wherein the storage capacitor has a capacitance between about 1 fF and about 55 fF.

In another embodiment, a sub-pixel circuit is formed in a stack. The sub-pixel circuit has a driving TFT. The driving TFT has a source disposed on a top surface of the stack, a drain on the top surface of the stack, and a conductive channel formed in the stack. The conductive channel has a first end and a second end. The first end is electrically coupled to the source and the second end is electrically coupled to the drain. The sub-pixel circuit has at least one switching TFT. The sub-pixel circuit additionally has at least one storage capacitor wherein the storage capacitor is inside the driving TFT disposed above the conductive channel and below the top surface.

In another embodiment, a display has a plurality of pixels. The pixels have a plurality of sub-pixels. Each sub-pixel of the plurality of pixels has an OLED area and a sub-pixel circuit. The sub-pixel circuit has a driving TFT and at least one switching TFT, wherein the at least one switching TFT is an oxide TFT. The sub-pixel circuit additionally has at least one storage capacitor wherein the storage capacitor has a capacitance between about 1 fF and about 55 fF.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

FIG. 2A shows a schematic illustration with a bottom emission OLED display.

FIG. 2B shows a schematic illustration with a top emission OLED display.

Figure 1:
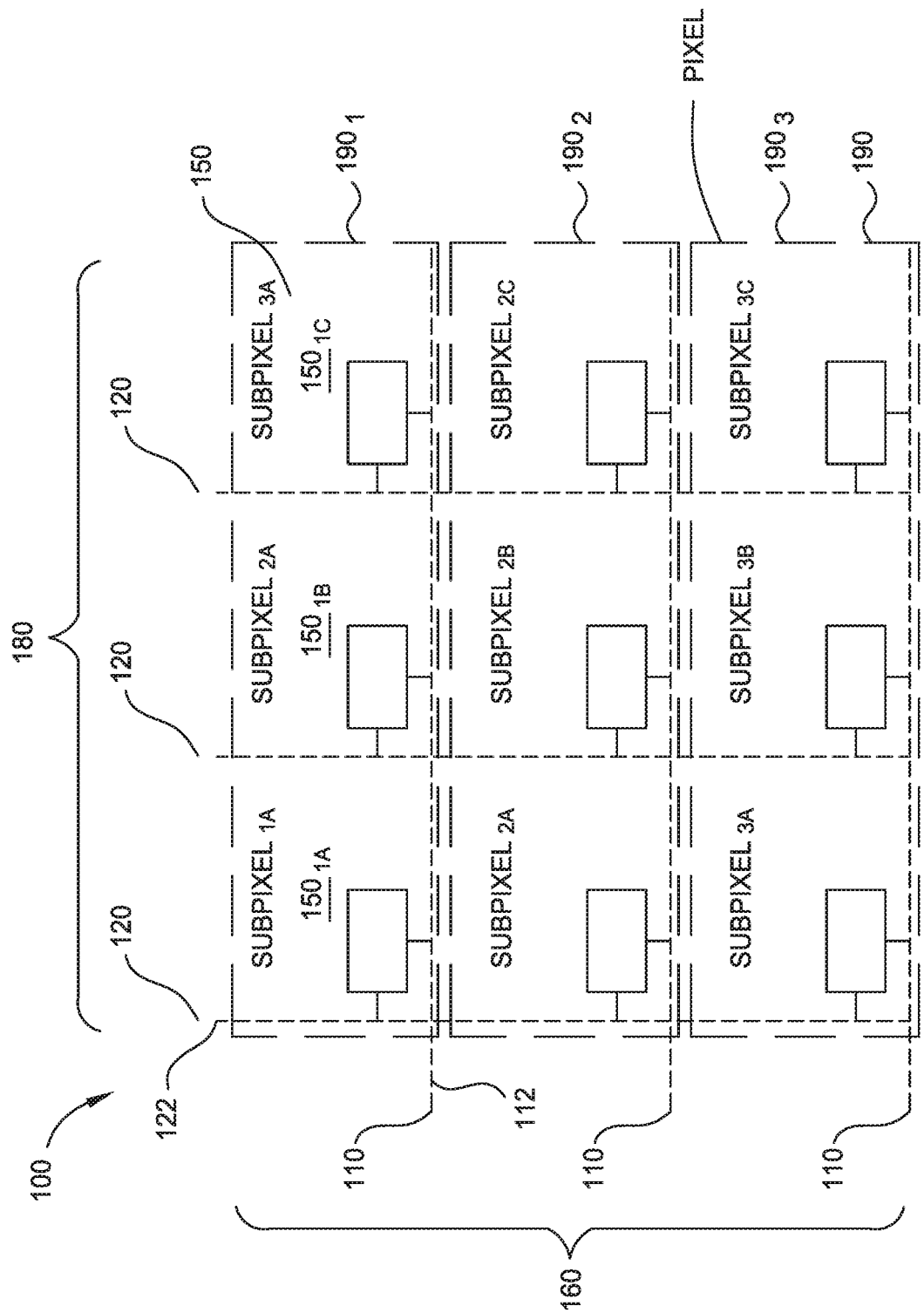
FIG. 1 is a schematic of an active matrix organic light emitting diode (OLED) panel, according to one or more embodiments.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, summary, or the following detailed description.

Off leakage current (Ioff) of metal oxide (MOx) thin film transistors (TFT) is usually 3 orders of magnitude lower than low temperature polysilicon (LTPS) TFT. Switching TFTs made by MOx TFTs can hold storage capacitance effectively due to the low Ioff for OLED pixel devices. Thus, the storage capacitance size can be reduced due to the lower leakage current across the switching TFT made by using a MOx than LTPS.

High resolution display devices for OLED (i.e., greater than 600 pixels per inch (ppi)) will have smaller pixel size. Everything shrinks with high resolution displays due to the shrunken pixel size. The TFT size can be shrunken based on pixel size shrinkage from high resolution. However, storage capacitor capacitance, i.e., size, is mainly determined by frame rate and the leakage current through the switching TFT connected to the storage capacitor for the OLED display. As results, disclosed herein is pixel circuits and device structures which permit the operation of high resolution OLED with smaller storage capacitor sizes.

Using the MOx switching TFT, a 3 order lower off leakage current (Ioff) can be achieved over LTPS switching TFTs. Thus, the MOx switching TFT can maintain storage capacitance for 1 frame holding time without losing capacitance over the LTPS switching TFT. This characteristic can reduce storage capacitor size between about 5 to about 10 times. The reduced capacitor sizes provide the space for a higher pixel density. The high k solution for smaller capacitor size s effective for up to about a 1200 pixels per inch (ppi) OLED while a switching MOx TFT can be applied to higher resolutions such as a resolution greater than 1200 ppi.

In order to operate a sub-pixel of an OLED pixel for a display, at least two transistors and one capacitor are required. A switching TFT passes data voltage to the capacitor (storage). The storage capacitor is connected to a gate for the driving TFT. The gate voltage of the driving TFT connected to the storage capacitance determines how much current of the driving TFT is flowing to the OLED to control brightness. The required capacitance of the storage capacitor is determined by the frame rate and the leakage current of the switching TFT connected to both the storage capacitor and the gate of the driving TFT for the display and is expressed in the following equation:

$$\Delta Q = C \times \Delta V = \text{leakage current} \times \Delta t$$

If the leakage current is 1 order lower, the capacitance (C) can be 1 order less as well. Replacing a conventional LTPS switching TFT with a MOx switching TFT can reduce leakage current by at least 1 to 2 orders of magnitude. The required capacitance can be also be reduced by the same level. Thus, the storage capacitor size can be reduced by using the MOx switching TFT. Further description of this arrangement may be found in the description of the figures below.

FIG. 1 is a schematic of an active matrix organic light emitting diode (OLED) panel 100. The OLED panel 100 has an array of pixels 190, i.e., a first pixel $190_1$, a second pixel $190_2$, a third pixel $190_3$, etc., arranged in rows 160 and columns 180. Each pixel 190 has a plurality of sub-pixels 150 for determining a value of the pixel 190. For example, a first pixel $190_1$ has a first sub-pixel $150_{1A}$, a second sub-pixel $150_{1B}$ and a third sub-pixel $150_{1C}$. Each sub-pixel 150 being a single color element of a respective pixel 190. However, the first pixel $190_1$ may have more than three sub-pixels 150, for example, a sub-pixel $150_{1N}$ wherein '1N' can represent any number of sub-pixels 150 for the first pixel $190_1$. Each row 160 in the OLED panel 100 can be accessed independently using gate lines 110. Each column 180 in the OLED panel 100 can be accessed using data lines 120. Addressing a first gate line 112 and a first data line 122 accesses the first sub-pixel $150_{1A}$ in the first pixel $190_1$ of the OLED panel 100. Each sub-pixel 150 may be similarly addressed in the OLED panel 100. In various embodiments, while each sub-pixel 150 is illustrated as being coupled to a single select line, each sub-pixel may be coupled to a plurality of select lines that may be used to control updating each sub-pixel 150. In such embodiments, the select lines may be driven at different times with different select signals to control the update timing of the sub-pixels 150.

In one or more embodiments, the OLED panel 100 may be an organic light emitting diode (OLED) display device. In such an embodiment, each of the sub-pixels 150 may comprise an anode electrode that is coupled to a corresponding select line or lines and a data line via one or more transistors. A sub-pixel data signal or signals is applied to each activated anode electrode to drive the anode electrode to a specified voltage level. An OLED display device additionally includes a cathode electrode that is driven to a voltage level by a processing system for display updating and one or more organic layers. The supply voltage is applied to each sub-pixel to drive sub-pixel for updating. In one embodiment, a positive supply voltage may be referred to as ELVDD and a negative supply voltage may be referred to as ELVSS.

FIG. 2A shows a schematic illustration with a bottom emission OLED display. OLED is positioned on the top of the sub-pixel circuit 220. Light from the OLED cannot pass through the sub-pixel circuit area 220 due to the direction of light emission, downward. The single sub-pixel 150 may be the first sub-pixel $150_{1A}$. However, the single sub-pixel 150 shown in FIG. 2A is generic to each of the sub-pixels 150, such as the first sub-pixel $150_{1A}$, and further discussion will be with regard to the generic sub-pixel 150. The sub-pixel 150 has a sub-pixel area 250. A portion of the sub-pixel area 250 is occupied by an organic light emitting diode (OLED) area 210. The OLED area 210 is the light-emitting element of the sub-pixel 150. The OLED area 210 is a current driven light-emitting device. The remaining portion of the sub-pixel area 250 is occupied by a sub-pixel circuit 220 that has one or more transistors, capacitors and metal routing connecting the transistors and capacitors for forming the sub-pixel circuit 220. The one or more transistors, capacitors and metal routing may be disposed within a different metal layer of a substrate (device) than another one of the transistors, capacitors and metal routing in forming the sub-pixel circuit 220. The sub-pixel circuit 220 controls the OLED area 210 providing the power needed to drive the sub-pixel 150, i.e., to emit or not emit light.

FIG. 2B shows a schematic illustration with a top emission OLED display. For the top emission OLED display, the OLED is positioned on the top of the sub-pixel circuit 220. The direction of light from the OLED is upward, so the sub-pixel circuits 220 do not block the light. Therefore, the area of the sub-pixel circuits 220 from top emission OLED display can be comparable with the OLED area 210, which allows higher density than the bottom emission OLED display.

Figures 3, 4:
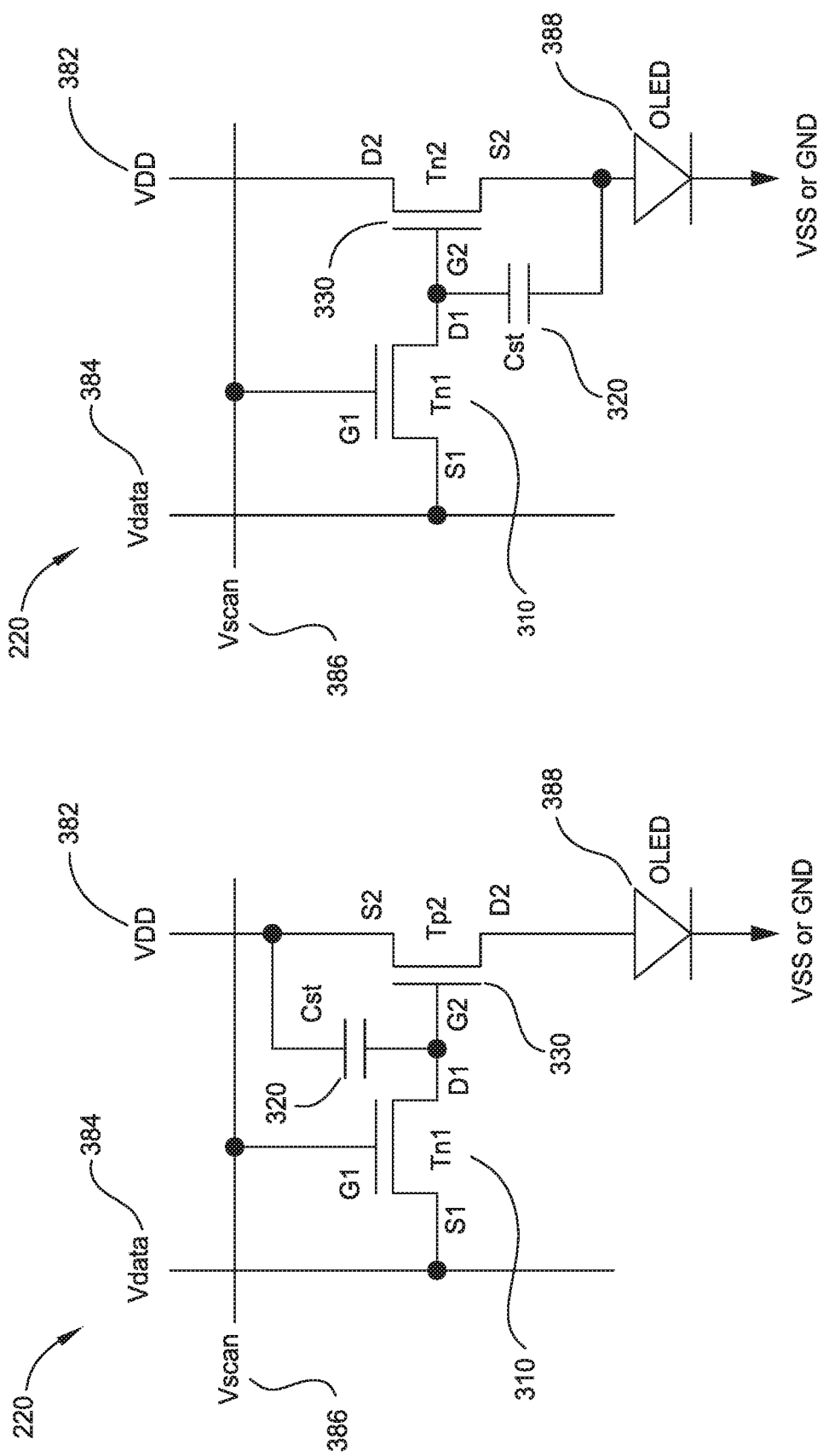
FIG. 3 illustrates an example sub-pixel circuit, according to one or more embodiments.
FIG. 4 illustrates another example sub-pixel circuit, according to one or more embodiments.

FIG. 3 and FIG. 4 illustrate example schematics of the sub-pixel circuit 220 for the sub-pixel 150, according to one or more embodiments. The sub-pixel circuit 220 has a plurality of thin-film transistor (TFT) and a storage capacitor. However, it should be appreciated that the sub-pixel circuit 220 may have more than two transistors and/or more than one capacitor. Generally, the sub-pixel circuit 220 includes a switching transistor 310, a current regulator or a driving transistor 330, and a storage capacitor 320. The transistors 310, 330 may be relatively low-leakage current transistors, such as oxide transistor, a low-temperature polycrystalline silicon (LTPS) transistor, or a hybrid of the LTPS and oxide, i.e., LTPO transistor. Preferably, the switching transistor 310 has a leakage current of not more than about $10^{-12}$ A. The driving TFT 330 may be a p-type LTPS TFT (Tp2) or a n-type LTPS TFT or n-type oxide TFT (Tn2). The switching TFT 310 may be an oxide TFT (Tn1) or hybrid LTPO.

The switching TFT 310 gate (G1) is connected to selection scan line (Vscan) 386 and the source-drain are connected between Vdata line 384 and the gate (G2) of driving TFT 330. An OLED 388, disposed in the OLED area 210 of the sub-pixel 150 pixel in a full-color display, is electrically connected to the driving transistor 330. The circuit for the OLED 388 continues further to a low level supply voltage (VSS) or ground (GND). The OLED 388 is controlled by the sub-pixel circuit 220 and has the cathode connected to the common terminal or conductor and the anode is connected through the source-drain of the driving TFT 330 to a high level power supply (VDD) 382. The role of the storage capacitor (Cst) 320 is for holding the gate voltage of the driving TFT (Tn2/Tp2) 330. In FIG. 3, the storage capacitor 320 is connected between the VDD 382 and the gate (G2) of driving TFT 330. In FIG. 4, the storage capacitor 320 is connected between the OLED 388 and the gate (G2) of driving TFT 330.

When a select signal appears on Vscan line 386 and a data signal appears on Vdata line 384, the OLED 388 is addressed or selected. The transistors may be turned on and off by applying a select signal to the gate of the transistor 310/330 via the selected line. The signal on the Vscan line 386 is applied to the gate (G1) of switching transistor 310, turning "ON" the transistor. The data signal on Vdata line 384 is applied through the source-drain of switching transistor 310 to the gate (G2) of driver transistor 330, turning the driver transistor 330 "ON" according to the amplitude and/or duration of the data signal. The driver transistor 330 then supplies power, generally in the form of driving current, to OLED 388, the brightness or intensity of light generated by OLED 388 may depend upon the amount and/or duration of current supplied. The storage capacitor 320 memorizes the voltage on the Vdata line 384 after switching transistor 310 is turned "OFF".

Figure 5:
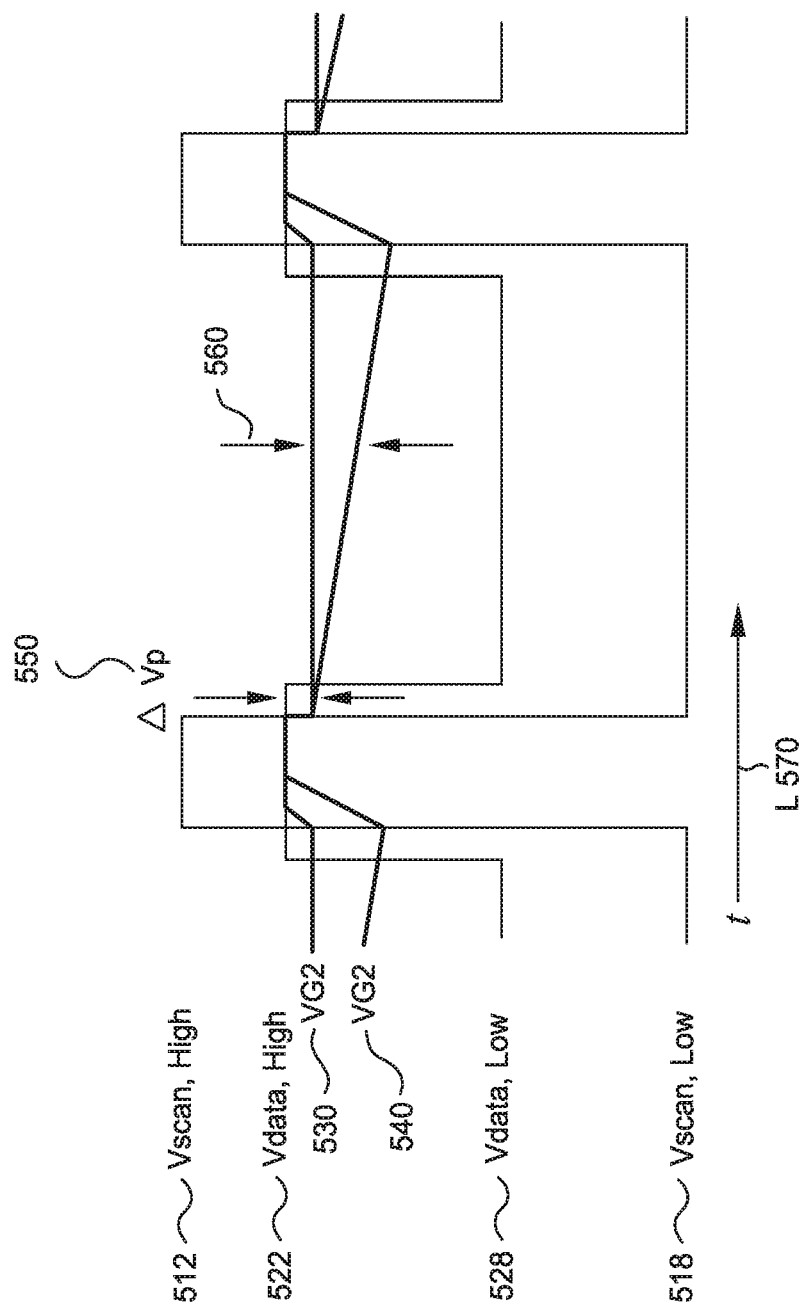
FIG. 5 illustrates graph of the change in voltage across the switching transistor, according to one or more embodiments.

FIG. 5 illustrates graph of the change in voltage across the switching transistor, according to one or more embodiments. The graph 500 illustrates the voltage for the Vdata line 384 and the Vscan line 386 over a time 570. The Vscan line 386 traverses between a low Vscan voltage 518 and a high Vscan voltage 512 over time 570. The Vdata line 384 traverses between a low Vdata voltage 528 and a high Vdata voltage 522 over the same period of time 570. A voltage value, by which the pixel voltage is reduced, is referred to as a kickback voltage (ΔVp) shown at item 550 in the graph of FIG. 5. The kickback voltage 550 is varied based on the data signal and induced when the gate signal falls, i.e., the Vscan line 386 moves from the high Vscan voltage 512 to the low Vscan voltage 518. The gate (G2) voltage (VG2) for driving the OLED is maintained by the capacitor (Cst) 320. Leakage across the switching TFT 310 results in a declining value for the VG2. Graph line 530 illustrates the VG2 without leakage through the switching TFT 310 (Oxide TFT-Tn1). Graph line 540 illustrates the VG2 having a small leakage through the switching TFT 310 (LTPS TFT-Tn1). The voltage difference 560 between the VG2 having no leakage (line 530) and the VG2 having leakage (line 540) is compensated by the capacitor Cst 320. The capacitor Cst 320 is sized to compensate for the kickback voltage and the leakage to maintain the voltage at the gate (G2). Where Cgd1 is the TFT capacitor between G1 and D1 and Cgs2 is the TFT capacitor between G2 and D2, both the VG2 and kickback voltage (ΔVp) can be calculated with the following equations:

$$VG2 = (V\text{data,High} - V\text{data,Low}) \times \{(Cst+Cgs2)/(Cst+Cgd1+Cgs2)\}$$

$$\Delta Vp = (V\text{data,High} - V\text{data,Low}) \times \{(Cgd1)/(Cst+Cgd1+Cgs2)\}$$

If oxide TFT instead of LTPS TFT is used as Tn1, VG2 voltage drop can be minimize due to the smaller leakage current through Tn1. If Cst is much greater than Cgd1, the kick back voltage ΔVp and the VG2 voltage drop, which is caused by Cgd1 (TFT capacitor between G1 and D1), can be minimize.

Referring back to FIG. 3, if oxide TFT instead of LTPS TFT is used as Tn1, can minimize VG2 voltage drop due to the smaller leakage current through Tn1. If Cst is much greater than the Cgd1, the kickback voltage ΔVp and the voltage drop VG2, which is caused by Cgd1 (TFT capacitor between G1 and D1) can be minimized. Here, Tn1 is an n-type Oxide TFT, Tp2 is a p-type LTPS TFT. At least 2 TFTs are utilized with one being the driving TFT (Tp2) and the other being the switching TFT (Tn1).

Referring back to FIG. 4, if an oxide TFT is used instead of LTPS TFT as Tn1, the voltage drop VG2, due to the smaller leakage current through Tn1 can be minimized. If Cst is much greater than Cgd1, the kickback voltage ΔVp, the voltage drop VG2, caused by Cgd1 (TFT capacitor between G1 and D1) can all be minimized. Here, Tn1 is an n-type oxide TFT and Tn2 is an n-type LTPS TFT or n-type oxide TFT. Thus, at least one capacitor and two TFTs are utilized for the sub-pixel circuit 220 wherein the two TFTs involve one driving TFT (Tn2) and one switching TFT (Tn1).

The Cst 320 is sized to compensate for the ΔVp 550 as well as leakage current across the switching TFT 310. Referring now to FIGS. 3 and 4, the capacity (size) of the Cst needs to be greater than about 9 time Cgs to minimize voltage kick back where Cgs is the capacitance between the gate and the source of the switching TFT 310.

For a TFT length of about 10 μm, width of about 40 μm and a gate oxide thickness of about 100 nm and a Cgs of about 0.50 fF/μm², the preferred Cst value range is between about 2.2 fF greater than the Cst and less than about 55 fF.

For a TFT length of about 10 μm, width of about 40 μm and a gate oxide thickness of about 150 nm and a Cgs of about 0.34 fF/μm², the preferred Cst value range is between about 1.5 fF greater than the Cst and less than about 37 fF.

For a TFT length of about 10 μm, width of about 40 μm and a gate oxide thickness of about 200 nm and a Cgs of about 0.25 fF/μm², the preferred Cst value range is between about 1.1 fF greater than the Cst and less than about 28 fF.

Figure 6A:
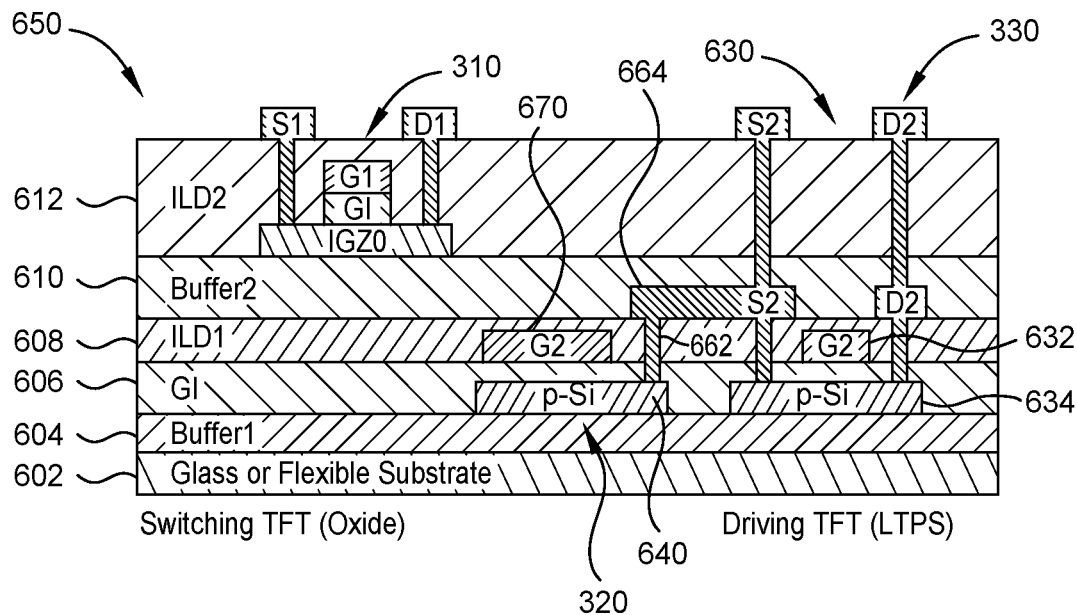
FIGS. 6A and 6B illustrate examples of a sub-pixel circuit formed in a substrate, according to one or more embodiments.
Figure 6B:
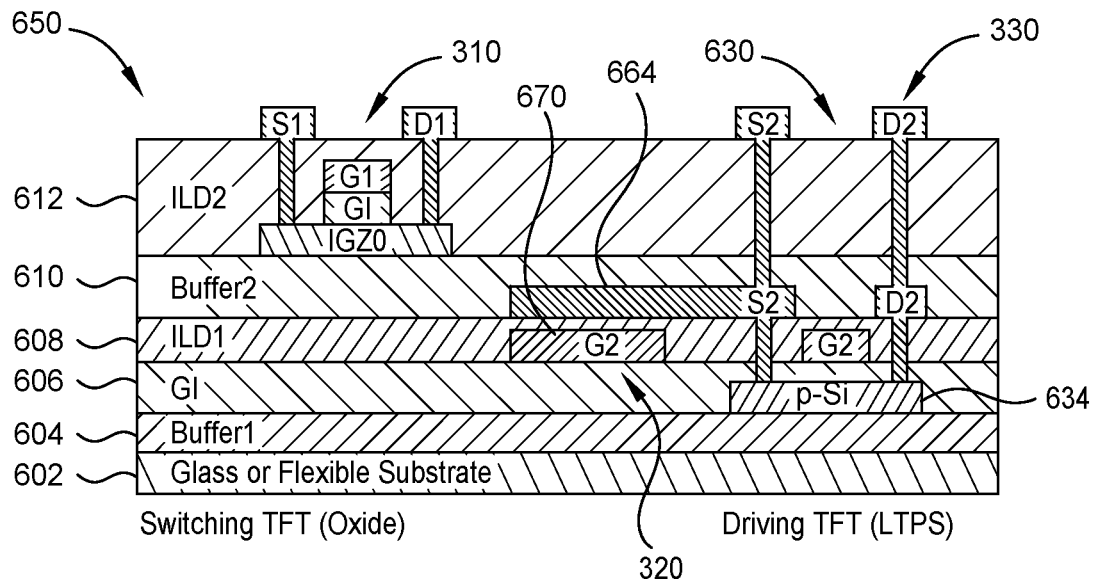

FIGS. 6A and 6B illustrate examples of a sub-pixel circuit formed in a stack 650, according to one or more embodiments. The stacks 650 have a first layer 602. A second layer 604 is disposed on the first layer 602. In one embodiment, the second layer 604 is in contact with the first layer 602. A third layer 606 is disposed on the second layer 604. In one embodiment, the third layer 606 is in contact with the second layer 604. A fourth layer 608 is disposed on the third layer 606. In one embodiment, the fourth layer 608 is in contact with the third layer 606. A fifth layer 610 is disposed on the fourth layer 608. In one embodiment, the fifth layer 610 is in contact with the fourth layer 608. A sixth layer 612 is disposed on the fifth layer 610. In one embodiment, the sixth layer 612 is in contact with the fifth layer 610.

The first layer 602 may be a glass or other suitable flexible substrate. The second layer 604 is a first buffer layer. The second layer 604 (buffer 1) may be composed of a material such as a p-type silicon (boron-doped silicon), vanadium oxide ($V_2O_5$), aluminum nitride (AlN), tungsten nitride, other metal oxides or metal nitrides, or combinations thereof. The third layer 606 is a gate insulating layer (GI). The third layer 606 (GI) may be composed of a material such as for example, silicon di-oxide ($SiO_2$), polymethylsilsesquioxane (PMSG) or other suitable material. The fourth layer 608 is a first inter layer dielectric (ILD). The fourth layer 608 (ILD1) may be composed of a material such as oxides (both doped and undoped), nitrides, oxynitrides, and carbides such as silicon-based dielectric films. The fifth layer 610 is a second buffer layer. The fifth layer 610 (buffer 2) may be formed from substantially the same list of materials as the second layer 604 (buffer 1). The sixth layer 612 is a second inter layer dielectric (ILD). The sixth layer 612 (ILD2) may be formed from substantially the same list of materials as the fourth layer 608 (ILD1).

The switching TFT 310 is illustrated in the sixth layer 612 (ILD2). The switching TFT 310 is an oxide TFT. The switching TFT 310 has a source (S1) and a drain (D1) disposed on top of the ILD2, i.e., sixth layer 612. The source (S1) and drain (D1) are coupled to vias in the sixth layer 612 to a conductive channel (IGZO), in this example the conductive channel formed from indium gallium zinc oxide (IGZO), but other materials may be equally suitable. The conductive channel (IGZO) is formed on the top of the fifth layer 610 (buffer 2). A gate insulating (GI) material is formed on the conductive channel (IGZO) in the sixth layer 612 (ILD2). The GI material is composed of silicon di-oxide (S102), polymethylsilsesquioxane (PMSG) or other suitable material. A gate G1 material is formed on top of the gate insulating (GI) material. The gate (G1) is a metal conducting material, for example indium tin oxide (ITO), zinc oxide, indium gallium zinc oxide (IGZO), or other suitable material.

The driving TFT 330 is illustrated in third layer 606 through the sixth layer 612 (ILD2). The driving TFT 330 is an LTPS TFT. The driving TFT 330 has a source (S2) and a drain (D2) disposed on top of the ILD2, i.e., sixth layer 612. The source (S2) and drain (D2) are coupled to vias in the sixth layer 612 and the fifth layer 610, and a second source (S2) 664 and second drain (D2) disposed in the fifth layer 610 (buffer 2). The vias extend further through the ILD1 and into the GI layer to a conductive channel 634 of polycrystalline silicon (LTPS). The conductive channel 634 formed on the top surface of the second layer 604 (Buffer 1). A gate (G2) 632 is formed in the fourth layer 608 (ILD1) above the conductive channel 634 and on top of the third layer 606 (GI). The G2 material is composed of silicon di-oxide (SiO2), polymethylsilsesquioxane (PMSQ) or other suitable material. The third layer 606 (GI) being the gate insulating material between the conductive channel 634 and the gate (G2) 632.

Turning now strictly to FIG. 6A, the capacitor 320 is formed in the third layer 606 (GI), the fourth layer 608 (ILD1) and the fifth layer 610 (Buffer 2) adjacent the driving TFT 330. The second source (S2) 664 extends in laterally in the fifth layer 610 (Buffer 2) in a direction opposite from the second drain (D2). A via 662 extends from the second source (S2) 664 through the fourth layer 608 (ILD1) and into the third layer 606 (GI). The via 662 extends to a conductive channel 640 of polycrystalline silicon (LTPS). The conductive channel 640 is disposed on the top surface of the second layer 604 (Buffer 1). The conductive channel 634 is isolated from the conductive channel 640 by the gate insulating material of the third layer 606. A gate (G2) 670 is formed in the fourth layer 608 (ILD1) above the conductive channel 640 and on top of the third layer 606 (GI). The gate (G2) 670 is isolated from the gate (G2) 632 with the via 662 there between.

Turning now strictly to FIG. 6B, the capacitor 320 is formed in the fourth layer 608 (ILD1) and the fifth layer 610 (Buffer 2) adjacent the driving TFT 330. The second source (S2) 664 extends laterally in the fifth layer 610 (Buffer 2) in a direction away from the second drain (D2). The gate (G2) 670 is formed in the fourth layer 608 (ILD1) and on top of the third layer 606 (GI). The resulting capacitor having one more mask reduction from the capacitor formed in FIG. 6A.

The benefit illustrated above in FIGS. 6A and 6B is that one more mask reduction is possible and the formation of the sub-pixel circuit 220 is less complex.

Figure 7A:
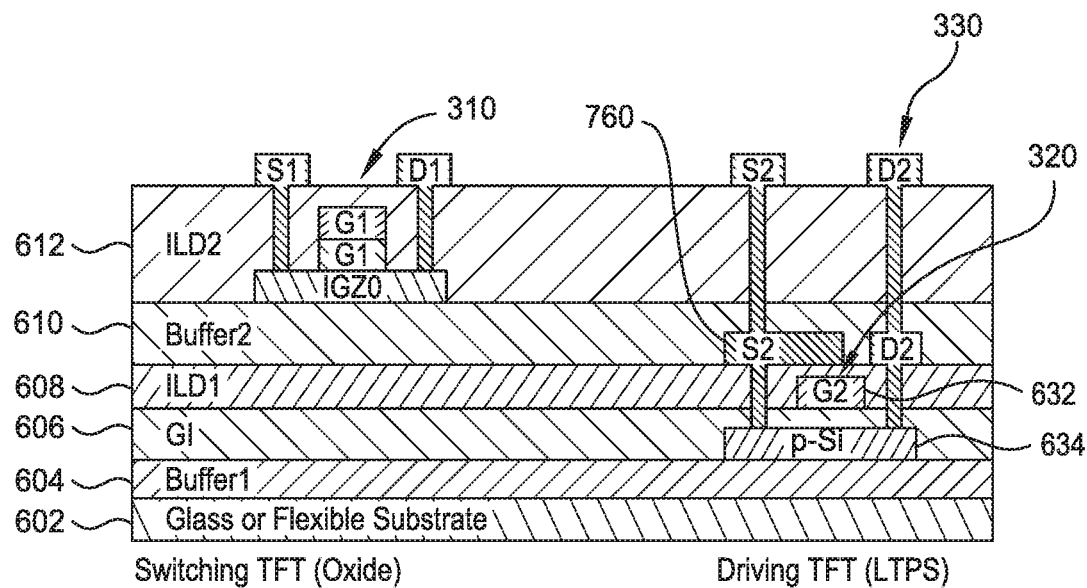
FIGS. 7A and 7B illustrate examples of a sub-pixel circuit formed in a substrate, according to one or more embodiments.
Figure 7B:
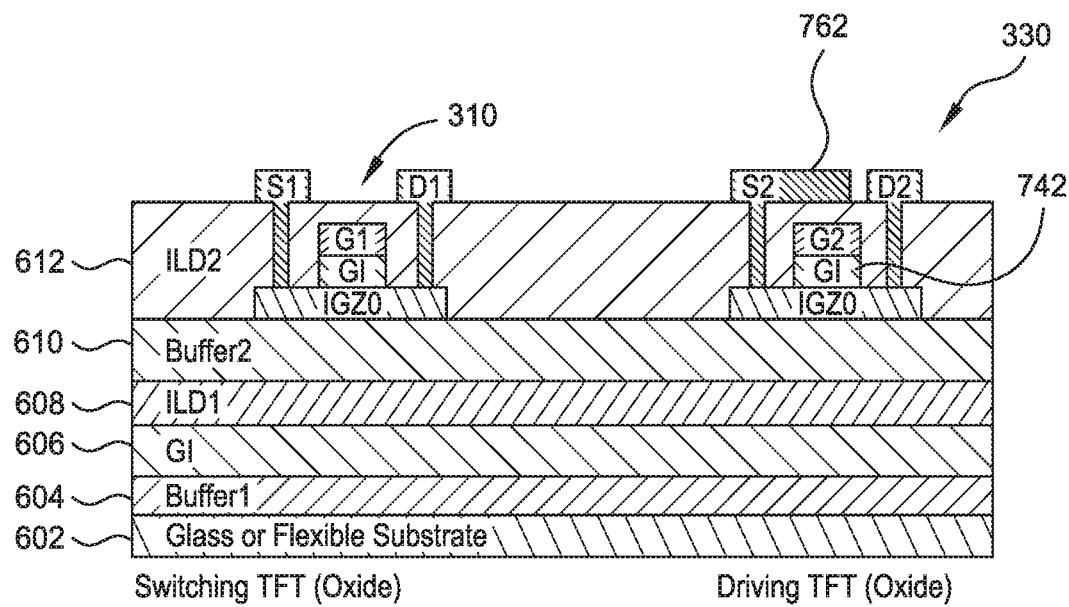

FIGS. 7A and 7B illustrate examples of a sub-pixel circuit formed in a substrate, according to one or more embodiments. The switching TFT 310 illustrated is an oxide type and substantially similar to that described above with respect to FIGS. 6A and 6B.

Turning now strictly to FIG. 7A, the driving TFT 330 is illustrated in third layer 606 through the sixth layer 612 (ILD2). The driving TFT 330 is an LTPS TFT. The driving TFT 330 has a source (S2) and a drain (D2) disposed on top of the ILD2, i.e., sixth layer 612. The source (S2) and drain (D2) are coupled to vias in the sixth layer 612 and the fifth layer 610, and a second source (S2) 664 and second drain (D2) disposed in the fifth layer 610 (buffer 2). The vias extend further through the ILD1 and into the GI layer to a conductive channel 634 of polycrystalline silicon (LTPS). The conductive channel 634 formed on the top surface of the second layer 604 (Buffer 1). A gate (G2) 632 is formed in the fourth layer 608 (ILD1) above the conductive channel 634 and on top of the third layer 606 (GI). The G2 material is composed of silicon di-oxide (SiO2), polymethylsilsesquioxane (PMSQ) or other suitable material. The third layer 603 (GI) being the gate insulating material between the conductive channel 634 and the gate (G2) 632.

The capacitor 320 is formed in the fourth layer 608 (ILD1) and the fifth layer 610 (Buffer 2) within the driving TFT 330. A second source (S2) 760 extends laterally in the fifth layer 610 (Buffer 2) in a direction towards the second drain (D2) and above the gate (G2) 632 formed in the fourth layer 608 (ILD1). The resulting capacitor located in the driving TFT 330 reducing the footprint for the sub-pixel circuit 220.

Turning now strictly to FIG. 7B, the driving TFT 330 is illustrated in the sixth layer 612 (ILD2). The driving TFT 330 is an oxide TFT. The driving TFT 330 has a source (S2) 762 and a drain (D2) disposed on top of the ILD2, i.e., sixth layer 612. The source (S2) and drain (D2) are coupled to vias in the sixth layer 612 to a conductive channel (IGZO), in this example the conductive channel formed from indium gallium zinc oxide (IGZO), but other materials may be equally suitable. The conductive channel (IGZO) is formed on the top of the fifth layer 610 (buffer 2). A gate insulating (GI) material 742 is formed on the conductive channel (IGZO) in the sixth layer 612 (ILD2). The GI material 742 is composed of silicon di-oxide (SiO2), polymethylsilsesquioxane (PMSQ) or other suitable material. A gate G2 material is formed in on top of the gate insulating (GI) material 742. The gate (G2) is a metal conducting material, for example indium tin oxide (ITO), zinc oxide, indium gallium zinc oxide (IGZO), or other suitable material.

The capacitor 320 is formed inside the driving TFT 330. The source (S2) 762 extends along the top surface of the sixth layer 612 toward the drain (D2) and above the gate (G2) material to form the capacitor.

Advantageously, the storage capacitor 320 is formed nearer to the driving TFT 330 resulting in higher resolution by the reduction of pixel circuitry area.

Figure 8A:
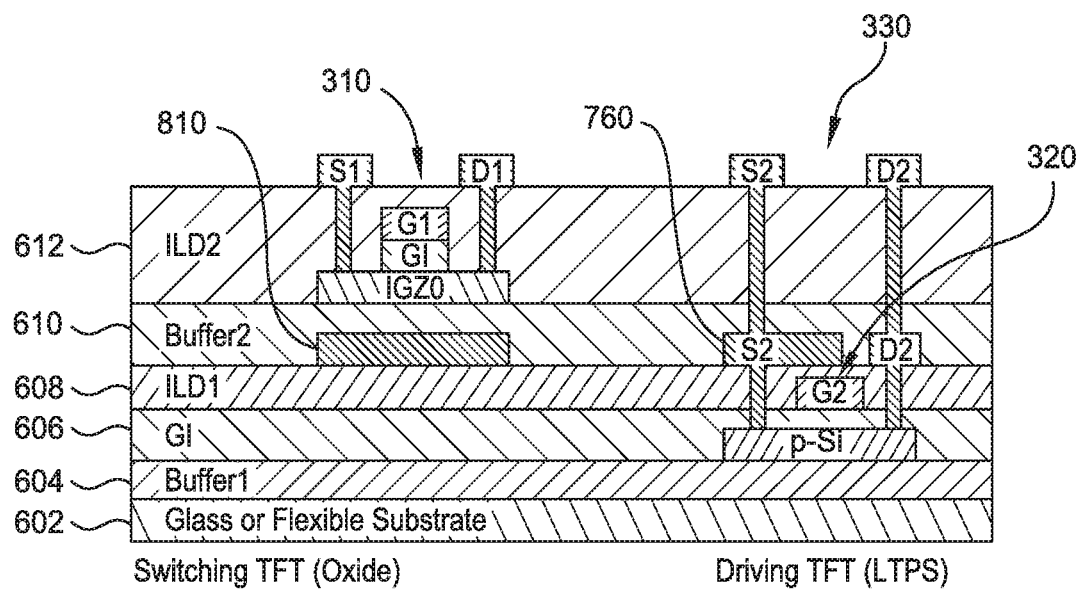
FIGS. 8A and 8B illustrate examples of a sub-pixel circuit formed in a substrate, according to one or more embodiments.
Figure 8B:
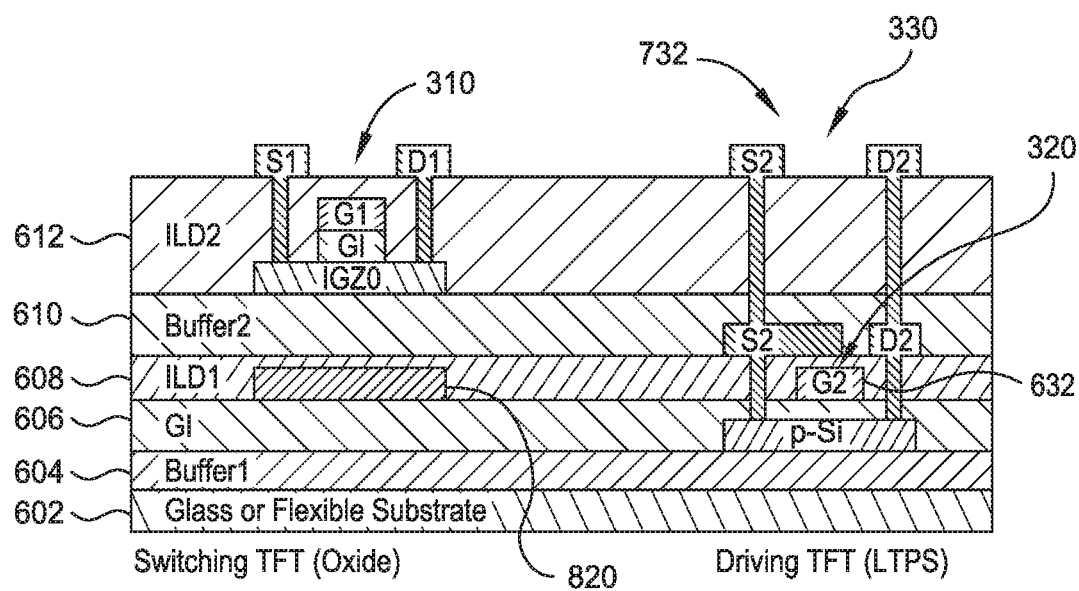

FIGS. 8A and 8B illustrate examples of a sub-pixel circuit formed in a substrate, according to one or more embodiments. The switching TFT 310 illustrated is an oxide type and substantially similar to that described above with respect to FIGS. 6A and 6B. In FIG. 8A, the switching TFT 310 has a light shield 810 formed in the fifth layer 610 (buffer 2) under the conductive channel (IGZO). In FIG. 8B, the switching TFT 310 has a light shield 820 formed in the fourth layer 608 (ILD1) under the conductive channel (IGZO). The light shields 810/820 are formed from a metal material. The metal is used under the oxide switching TFT 310 to improve the stability thereof.

The driving TFT 330 and capacitor 320 illustrated in FIGS. 8A and 8B are substantially as described with respect to the driving TFT 330 discussed above with respect to FIG. 7A. The driving TFT 330 is an LTPS TFT and is disposed in third layer 606 through the sixth layer 612 (ILD2). The capacitor 320 is formed in the fourth layer 608 (ILD1) and the fifth layer 610 (Buffer 2) within the driving TFT 330. The resulting capacitor located in the driving TFT 330 reduces the footprint for the sub-pixel circuit 220.

Advantageously, the storage capacitor 320 is formed near the driving TFT 330 resulting in higher resolution by the reduction of pixel circuitry area. Additionally as stated above, the light shield 810/820 improves the stability of the switching TFT 310.

Figure 9A:
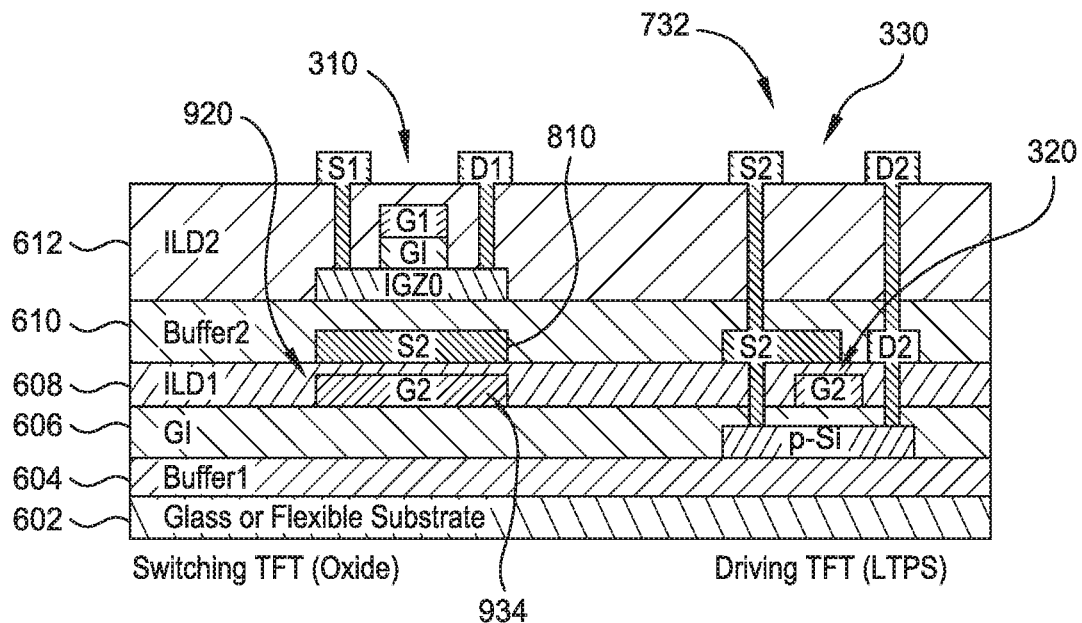
FIGS. 9A and 9B illustrate examples of a sub-pixel circuit formed in a substrate, according to one or more embodiments.
Figure 9B:
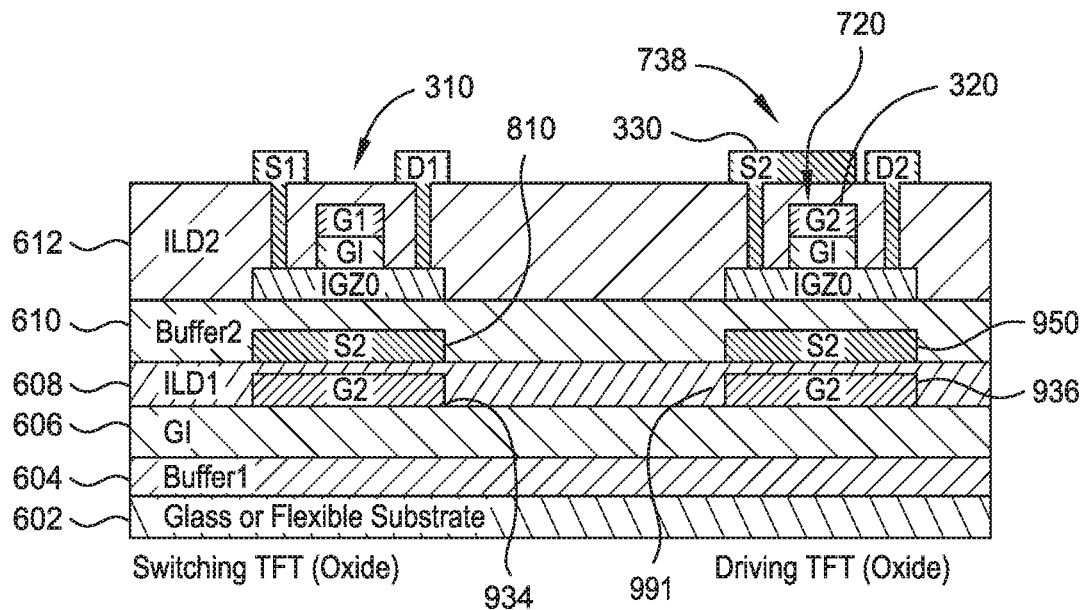

FIGS. 9A and 9B illustrate examples of a sub-pixel circuit formed in a substrate, according to one or more embodiments. The switching TFT 310 illustrated is an oxide type and substantially similar to that described above with respect to FIGS. 6A and 6B. The light shield 810 is formed in the fifth layer 610 (buffer 2) under the conductive channel (IGZO). Additionally, a gate material (G2) 934 is formed in the fourth layer 608 (ILD1) under the light shield 810. The gate material (G2) 934 is formed from a metal material. The light shields 810 and gate material (G2) 934 forms a second capacitor 920 under the switching TFT 310.

Turning now strictly to FIG. 9A, the driving TFT 330 and the capacitor are as described above with respect to FIG. 7A. That is, the capacitor 320 is formed inside the driving TFT 330 for minimizing the sub-pixel circuit 220.

Turning now strictly to FIG. 9B, the driving TFT 330 and the capacitor 320 are as described above with respect to FIG. 7B. The capacitor 320 is formed inside the driving TFT 330 for minimizing the sub-pixel circuit 220. Additionally, a gate material (G2) 936 is formed in the fourth layer 608 (ILD1) under a source layer (S2) 950. The gate material (G2) 936 is formed from a metal material. The source layer (S2) 950 and gate material (G2) 936 forms yet another capacitor 991 under the driving TFT 330.

Advantageously, the storage capacitor 320 is formed near the driving TFT 330 resulting in higher resolution by the reduction of pixel circuitry area. The light shield 810 improves the stability of the switching TFT 310. Additionally, a storage capacitor 920 is formed under the switching TFT 310 maintaining the footprint of the sub-pixel circuit 220 while increasing the storage capacity and allowing for a longer frame rate.

Pixel circuits consist of one driving TFT, at least one switching TFT and at least one storage capacitor. The switching TFT is connected to both the gate of the driving TFT and the storage capacitor. The storage capacitor size can be reduced by using oxide TFT as a switching TFT due to a two to three order of magnitude lower leakage current compared to LTPS TFT. However, the storage capacitor cannot be very small due to the voltage kick back. Shown above, the storage capacitor (Cst) proposed size is between about 1 fF and about 55 fF. The gate insulator thickness is between about 100 nm and about 200 nm. The TFT channel length is between about 0.5 μm and 3 μm. And the TFT channel width is between about 1 um and about 4 μm.

Device structures of the switching TFT shown above illustrated a storage capacitor and driving TFT having the storage capacitor formed between the polycrystalline silicon and gate metal. Alternately, the structure illustrates the storage capacitor formed between the gate and the source metals for reducing the number of masks during the production. In yet another alternative, a high resolution structure is provided where the storage capacitor is formed by overlapping gate and source metals of driving transistor. In yet another alternative, a high resolution structure is provided where the storage capacitor is formed under the oxide TFT. In yet other structures, a light shield formed of metal is added under oxide TFT. These structures provided an oxide TFT having a leakage current of less than 1E-12 (A) which allowed for a storage capacitor of about 7.5 pA×(1/60 sec)/0.35V or about 36 fF.

Significant OLED panel power saving are achieved with variable refresh rate (VRR) [60 Hz 30 Hz, 15 Hz, 1 Hz]. However, refresh rates lower than 60 Hz can result in visual artifacts such as flicker and sudden change in brightness. The flicker and sudden change in brightness is minimized with a smaller leakage current through switching TFT connected to hold storage capacitor (C1) for data voltage holding in LCD and OLED. If the storage capacitor (C1) value needed is greater than 36 fF, an additional storage capacitor can be provided as seen in FIG. 9A and FIG. 9B. If the storage capacitor size is to be double (for example to 72 fF), the ΔVG will be about half, i.e., around 0.175V. Thus an improve uniformity by the reduction of VG variation is achieved. Additionally, if the leakage current is half, the required storage capacitor value will be half, i.e., around 18 fF. The in pixel storage capacitor area is reduced to about half of the previous size for the circuit allowing higher PPI by the reduction of the pixel size area.

These and other advantages may be realized in accordance with the specific embodiments described as well as other variations. It is to be understood that the above description is intended to be illustrative, and not restrictive. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the following claims, the terms "first," "second," and "third," etc. are used merely as labels, and are not intended to impose numerical requirements on their objects.

What is claimed is:

1. A sub-pixel circuit for a display, the sub-pixel circuit comprising:
   a driving TFT;
   at least one switching TFT wherein the at least one switching TFT is an oxide TFT; and
   at least one storage capacitor, wherein the storage capacitor is formed by overlapping a gate metal and a source metal of the driving TFT, and wherein the storage capacitor has a capacitance between about 1 fF and about 55 fF.

2. The sub-pixel circuit of claim 1, wherein the driving TFT is an oxide TFT.

3. The sub-pixel circuit of claim 1, wherein the driving TFT is a polysilicon TFT.

4. The sub-pixel circuit of claim 1, wherein the at least one switching TFT further comprises:
   a gate insulating layer thickness of between about 100 nm and about 200 nm;
   a TFT channel length of between about 0.5 µm and 3 µm; and
   a TFT channel width of between about 1 µm and about 4 µm.

5. The sub-pixel circuit of claim 4, wherein the at least one switching TFT further comprises:
   a TFT leakage current less than about 1E-12 (A).

6. A sub-pixel circuit formed in a stack, the sub-pixel circuit comprising: a driving TFT comprising: a source disposed on a top surface of the stack;
   a drain on the top surface of the stack; and a conductive channel formed in the stack, the conductive channel having a first end and a second end, wherein the first end is electrically coupled to the source and the second end is electrically coupled to the drain; at least one switching TFT; a storage capacitor wherein the storage capacitor is inside the driving TFT disposed above the conductive channel and below the top surface; and a second storage capacitor formed below the switching TFT.

7. The sub-pixel circuit of claim 6 wherein the stack further comprises:
   a first layer forming a first buffer layer;
   a second layer formed from a gate insulating material;
   a third layer forming a first inter layer dielectric;
   a fourth layer forming a second buffer layer; and
   a fifth layer forming a second inter layer dielectric, wherein the at least one switching TFT is an oxide TFT and the at least one switching TFT does not extend into the fourth layer.

8. The sub-pixel circuit of claim 6, wherein the driving TFT is an oxide TFT.

9. The sub-pixel circuit of claim 6, wherein the driving TFT is a polysilicon TFT.

10. The sub-pixel circuit of claim 6, wherein the storage capacitor is formed by overlapping a gate metal and a source metal of the driving TFT.

11. The sub-pixel circuit of claim 7, wherein the storage capacitor further comprises:
    a gate insulator and the storage capacitor does not extend into the fourth layer.

12. The sub-pixel circuit of claim 7, wherein the storage capacitor extends below the fourth layer and the conductive channel is in the second layer.

13. The sub-pixel circuit of claim 7, further comprising:
    a light shield disposed below the switching TFT.

14. The sub-pixel circuit of claim 6, further comprising:
    a third storage capacitor formed below the driving TFT.

15. A display comprising:
    a plurality of pixels, the pixels comprising:
      a plurality of sub-pixels, each sub-pixel of the plurality of pixels comprising:
        an OLED area; and
        a sub-pixel circuit, the sub-pixel circuit comprising:
          a driving TFT;
          at least one switching TFT, wherein the at least one switching TFT is an oxide TFT; and
          at least one storage capacitor formed within the driving TFT, wherein the storage capacitor has a capacitance between about 1 fF and about 55 fF and is formed by overlapping a gate metal and a source metal of the driving TFT.

16. A display comprising:
    a plurality of pixels, the pixels comprising:
      a plurality of sub-pixels, each sub-pixel of the plurality of pixels comprising:
        an OLED area; and
        a sub-pixel circuit, the sub-pixel circuit comprising:
          a driving TFT;
          at least one switching TFT, wherein the at least one switching TFT is an oxide TFT;
          a first storage capacitor formed within the driving TFT, wherein the storage capacitor has a capacitance between about 1 fF and about 55 fF and is formed by overlapping a gate metal and a source metal of the driving TFT; and
          a second storage capacitor formed below the at least one switching TFT.

* * * * *